(12) United States Patent
Ichino et al.

(10) Patent No.: US 8,345,721 B2
(45) Date of Patent: Jan. 1, 2013

(54) METHOD FOR DRIVING OPTICAL TRANSMITTER

(75) Inventors: Moriyasu Ichino, Yokohama (JP); Hiroto Ishibashi, Yokohama (JP); Toru Ukai, Yokohama (JP); Yuanzhe Li, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 209 days.

(21) Appl. No.: 12/817,251

(22) Filed: Jun. 17, 2010

(65) Prior Publication Data

US 2010/0322271 A1 Dec. 23, 2010

(30) Foreign Application Priority Data

Jun. 18, 2009 (JP) .................................. 2009-145771

(51) Int. Cl.
*H01S 3/00* (2006.01)
(52) U.S. Cl. ...... 372/38.02; 372/26; 372/34; 372/29.01; 372/29.011; 372/29.02; 372/38.01; 372/38.07
(58) Field of Classification Search .................... 372/26, 372/38.02, 34, 29.01, 29.011, 29.02, 38.01, 372/38.07
See application file for complete search history.

(56) References Cited

U.S. PATENT DOCUMENTS

| 6,055,252 | A | * | 4/2000 | Zhang | .............................. 372/34 |
| 6,292,497 | B1 | | 9/2001 | Nakano | |
| 6,697,400 | B2 | | 2/2004 | Nomura | |
| 7,443,897 | B2 | * | 10/2008 | Ishibashi | .................... 372/38.09 |
| 7,853,154 | B2 | * | 12/2010 | Ikram et al. | ................... 398/192 |
| 2003/0231665 | A1 | * | 12/2003 | Ichino | ............................. 372/32 |
| 2004/0032890 | A1 | * | 2/2004 | Murata | ....................... 372/38.02 |
| 2005/0078722 | A1 | * | 4/2005 | Wu et al. | .................... 372/38.01 |
| 2006/0062116 | A1 | * | 3/2006 | Ishibashi | .................... 369/47.35 |
| 2006/0159142 | A1 | * | 7/2006 | Sanchez | ...................... 372/38.02 |
| 2006/0164712 | A1 | * | 7/2006 | Ishibashi | ....................... 359/239 |
| 2007/0160095 | A1 | * | 7/2007 | Kitagawa et al. | ......... 372/29.012 |
| 2009/0080903 | A1 | * | 3/2009 | Moriyasu | ...................... 398/182 |
| 2009/0135868 | A1 | * | 5/2009 | Ishibashi | .................... 372/38.02 |
| 2009/0147810 | A1 | * | 6/2009 | Ishibashi | ........................ 372/34 |
| 2012/0020381 | A1 | * | 1/2012 | Ishizaka | ..................... 372/38.02 |

FOREIGN PATENT DOCUMENTS

| JP | 11-135871 | 5/1999 |
| JP | 2002-237649 | 8/2002 |
| JP | 2005-19546 | 1/2005 |
| JP | 2008-270287 | 11/2008 |

* cited by examiner

*Primary Examiner* — Jessica Stultz
*Assistant Examiner* — Delma Forde
(74) *Attorney, Agent, or Firm* — Smith, GAmbrell & Russell, LLP

(57) ABSTRACT

A method to control an LD (laser diode) is disclosed. The method compares the operating temperature of the LD with a transition temperature. When the former temperature exceeds the latter, the modulation current is set based on the bias current, which is independently determined by the APC loop. On the other hand, the operating temperature is less than the transition temperature; the modulation current is determined by the operating temperature.

12 Claims, 8 Drawing Sheets

| Ambient Temperature | Bias Current $I_{bias}$ | Modulation Current $I_{mod}$ | |
|---|---|---|---|
| $T_0$ | | $I_{mod}^{(0)}$ | ⎫ |
| $T_1$ | | $I_{mod}^{(1)}$ | ⎬ TA1 |
| ≈ | ≈ | ≈ | |
| $T_m$ | | $I_{mod}^{(m)}$ | ⎭ |
| | $I_{bias}^{(0)}$ | $I_{mod}^{(m+1)}$ | ⎫ |
| | $I_{bias}^{(1)}$ | $I_{mod}^{(m+2)}$ | ⎬ TA2 |
| ≈ | ≈ | ≈ | |
| | $I_{bias}^{(n)}$ | $I_{mod}^{(n+m+1)}$ | ⎭ |

METHOD FOR DRIVING OPTICAL TRANSMITTER

BACKGROUND OF THE INVENTION

1. Field of the Invention

The present invention relates to a method to driver a semiconductor laser diode (hereafter denoted as LD), and an optical transmitter using the same.

2. Related Background Art

Various driving circuit have been well known in the field of the optical communication to drive an LD. The U.S. Pat. No. 6,697,400 has disclosed a method where the circuit provides a plural memories each storing the driving current $I_{ac}$ and the bias current $I_{dc}$ with respect to the temperature. The circuit reads out two currents depending on the temperature and determines the driving current. The Japanese patent application published as JP 2005-019546A has discloses another circuit where not only the bias current is adjusted depending on the temperature, but the modulation current is adjusted based on the optical output of the LD detected by a photodiode (hereafter denoted as PD) to keep the optical output and the extinction ratio in constant.

Another Japanese patent application published as JP 2008-270287 has disclosed a driving circuit where the bias and modulation currents are adjusted based on the temperature but the output of the temperature sensor exponentially varies to the temperature which enhances the accuracy of the driving.

The method to control the bias and modulation currents by a look-up-table (hereafter denoted as LUT), which stores values of those currents linked with temperatures, requires a large number of data for higher temperatures. Or, when the number of data is limited, the accuracy of the control or adjust of the optical output degrades. Because the threshold current of the LD exponentially varies in higher temperatures which results in considerable change in the modulation current to keep the average power and the extinction ratio of the LD in constant; accordingly, a large number of data for the modulation and bias currents is necessary for higher temperatures.

On the other hand, because the change of the driving current becomes gentle at lower temperatures, the driving current is sometimes necessary to be fine. In other words, a precise control of the driving current for the LD requests a fine temperature step at higher operating temperatures; while, requests a fine values for the current in lower temperatures, which inevitably expands the bit width for both the temperature and the driving current when the LD is digitally controlled.

SUMMARY OF THE INVENTION

A method according to the present invention relates to control the optical output from the LD by providing the modulation current and the bias current. The method may comprise steps of: (a) monitoring a temperature of the laser diode, (b) comparing the monitored temperature with a transition temperature, (c) setting the modulation current based on the monitored temperature when the monitored temperature is lower than the transition temperature, or based on the bias current when the monitored temperature is higher than the transition temperature.

The method may further include a step of, before the monitoring of the temperature, setting the bias current such that an average optical power output from the LD is kept constant in a preset value to the temperature of the LD. The method may also include steps of, before the setting of the modulation current and after the comparing of the temperature, calculating a temperature difference between the monitored temperature and a lastly monitored temperature, and setting the modulation current based on the monitored temperature when the temperature difference exceeds a threshold difference or based on the bias current when the temperature difference is less than the threshold current.

The method may further include a step of, before the monitoring of the temperature of the LD, setting the transition temperature to a value where a change of the extinction ratio with respect to the temperature of the LD becomes 0.1 dB. In the method of the present invention, the transition temperature may be 50±10° C.

Another aspect of the present invention relates to a method to start the operation of the optical transmitter. The method may comprise steps of, (a) powering on or negating DISABLE of the optical transmitter, (b) monitoring a temperature of the LD, (c) calculating a temperature difference between the monitored temperature and a lastly monitored temperature, and (d) setting the modulation current based on the monitored temperature when the temperature difference is greater than a threshold difference, or based on the bias current when the temperature difference is less than the threshold difference.

The method of the invention may further comprise steps of, after the calculating the temperature difference and before setting the modulation current, comparing the monitored temperature with a transition temperature when the temperature difference is less than the threshold difference, and setting the modulation current based on the monitored temperature when the monitored temperature is lower than the transition temperature, or based on the bias current when the monitored temperature is higher than the transition temperature.

BRIEF DESCRIPTION OF DRAWINGS

The invention may be more completely understood in consideration of the following detailed description of various embodiments of the invention in connection with the accompanying drawings, in which.

DETAILED DESCRIPTION OF PREFERRED EMBODIMENTS

Next, preferred embodiments according to the present invention will be described in detail. In the description of the drawings, the same elements will be referred by the same symbols or the same numerals without overlapping explanations.

Figure 1:
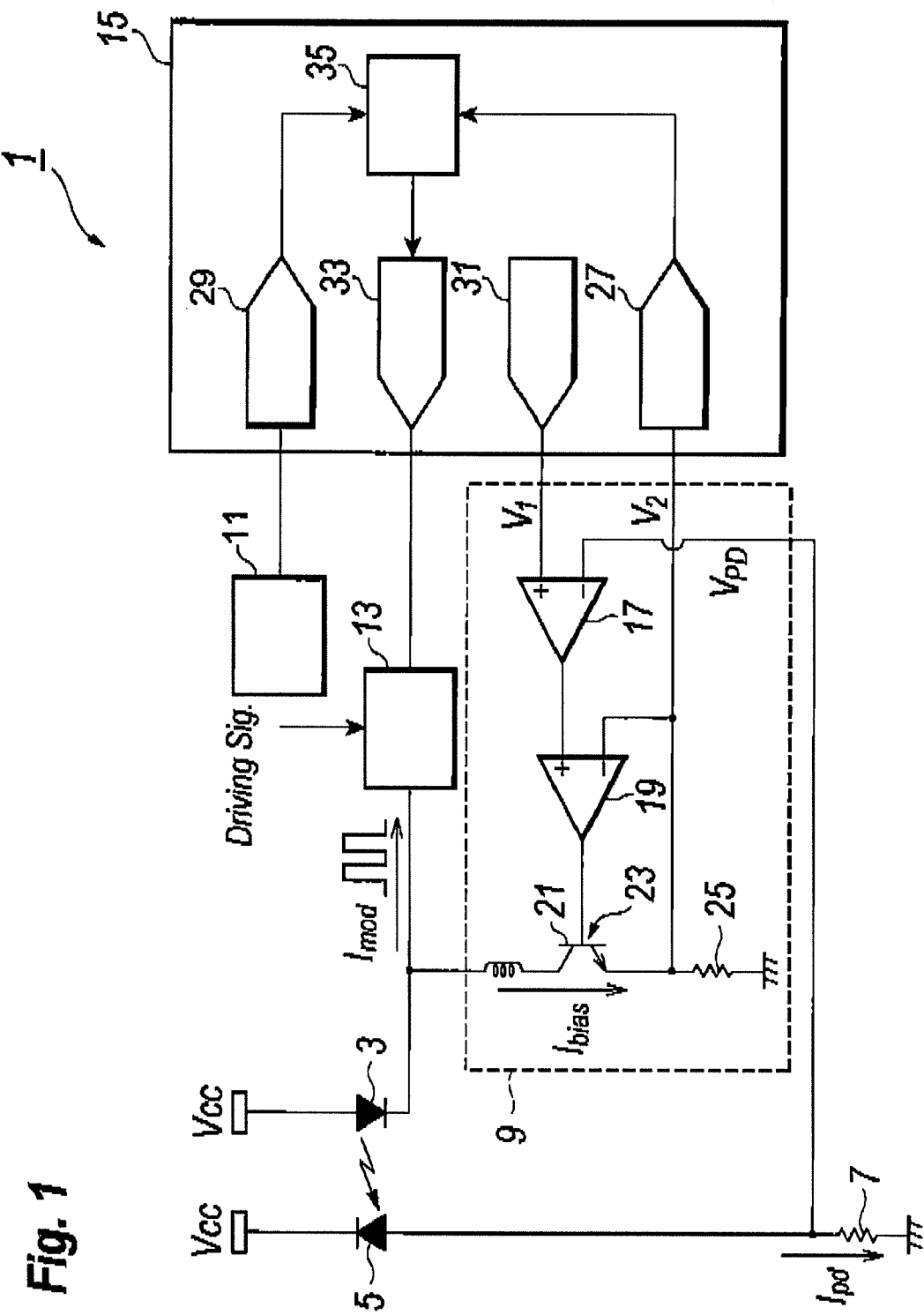
FIG. 1 shows a block diagram of an optical transmitter according to an embodiment of the present invention.

FIG. 1 is a block diagram of an optical transmitter according to an embodiment of the present invention. The optical transmitter 1 shown in FIG. 1 is applied in the optical communication system and generates an optical signal corresponding to an electrical data stream, which constitutes or is implemented within an optical transceiver.

One type of optical transceivers is called as a pluggable optical transceiver where the transceiver is implemented with an optical subassembly that converts an optical signal into an electrical signal, or an electrical signal into an optical signal, and is able to be hot-swapped to the host system, that is, the transceiver is pluggable without powering the host system off. The pluggable optical transceiver primarily comprises three components, one of which is a transmitter optical subassembly (TOSA) including an LD with a PD to monitor the optical output of the LD, both of which are enclosed in a package; another on of which is a receiver optical sub-assembly (ROSA) that encloses a PD to detect the optical signal and a trans-impedance amplifier (TIA) in a single package; and the last of which is an electronic circuit implemented on a circuit board. The pluggable optical transceiver described above often follows a multi-source-agreement in outer dimensions and electrical specifications thereof which is agreed by vendors and becomes a de facto standard. One of MSAs is, what is called as the SFP standard (Small Form-factor Pluggable).

Figures 2, 3:
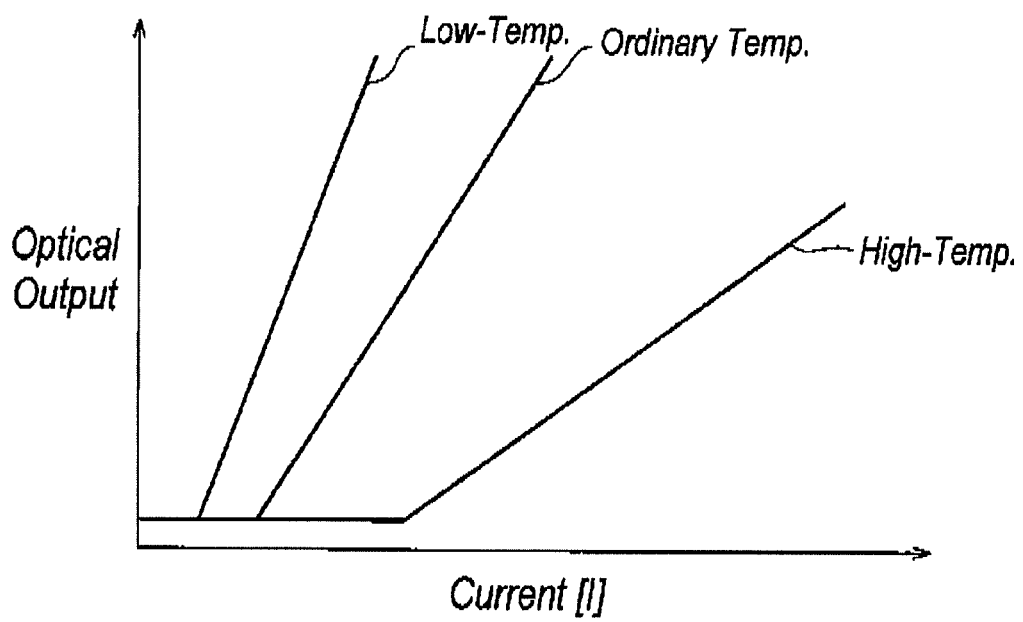
FIG. 2 shows an example of architectures of the look-up-table (LUT) referred in FIG. 1.
FIG. 3 shows a typical I-L characteristic of a semiconductor laser diode.

The optical transmitter comprises the TOSA and the circuit described above, and, as illustrated in the block diagram of FIG. 2, includes an LD 3, a PD 5 to monitor the optical output of the LD 3, a resistor 7 connected in the anode of the PD 5 to receive the output from the PD 5, a first control unit 9 to drive the LD 3 by providing a bias current to the LD 3, a temperature sensor 11 to monitor the temperature for the LD 3, an LD-driver 13 connected to the cathode of the LD 3 to drive the LD 3 by providing a modulation current corresponding to a data stream externally supplied, and a second control unit 15 to control the LD-driver 13 by receiving the output of the temperature sensor 11 and that of the first control unit 9. The PD 5, the resistor 7 and the first control unit 9 constitute the auto power control (APC) circuit.

The operation of the optical transmitter 1 will be described. The PD 5 generates a photocurrent $I_{pd}$ that reflects the optical output power, exactly the average output power, of the LD 5. This photocurrent $I_{pd}$ is converted into a voltage signal $V_{PD}$ by flowing in the resistor 7, and the voltage signal $V_{PD}$ enters the first control unit 9. The first control unit 9 includes two differential amplifiers, 17 and 19, a buffer transistor 21, and a resistor 25. The non-inverting input of the first amplifier 17 receives a voltage signal $V_1$ from the second control unit 15, while, the inverting input thereof receives the converted signal $V_{PD}$ from the resistor 7. The non-inverting input of the second amplifier 19 receives the output of the first amplifier 17, and the output thereof drives the buffer transistor 21. The buffer transistor 21 in the collector thereof is coupled with the LD 3 through an inductor, while the emitter is coupled with the inverting input of the second amplifier 19 and the second control unit.

The second control unit 15 operates such that the monitor voltage $V_{PD}$ becomes equal to the first reference voltage $V_1$ by adjusting the magnitude of the bias current $I_{bias}$. That is, the bias current $I_{bias}$ is set such that the average optical output of the LD 3, which is converted to the monitor voltage $V_{PD}$, becomes equal to the first reference $V_1$. This operation may compensate not only the time degradation of the LD 3 but the temperature dependence thereof. Generally, the temperature dependence of a semiconductor laser diode, such as that of the threshold current $I_{th}$ and the slope efficiency .eta., is far greater than that of an electronic device like a transistor. The resistor 25 coupled to the emitter of the buffer transistor 21 may generate a voltage signal of $V_2$ by flowing the bias current $I_{bias}$ therein. Thus, the second amplifier 19 combined with the buffer transistor 21 operates as a current source 23 whose output current, the bias current $I_{bias}$ and converted into the voltage signal $V_2$, becomes equal to the output of the first amplifier 17.

The second control unit 15 includes a central processing unit (CPU) 35, two analog-to-digital converter (A/D-C), 27 and 29, two digital-to-analog converter (D/A-C), 31 and 33, and a storage to save preset parameters. The storage may be included in the CPU 35. The first A/D-C 27 converts the second signal $V_2$ into a digital form, while the second A/D-C 29 converts a temperature Tc sensed by the temperature sensor 11 into another digital form. The first D/A-C 31 generates the first reference $V_1$ based on a parameter hold in the second control unit 15 for the first differential amplifier 17, while the second D/A-C 33 sets a signal corresponding to the modulation current $I_{mod}$ in the LD-driver 13.

The second control unit 15 decides the magnitude of the modulation current based on the temperature T sensed by the temperature sensor 11 or the current magnitude of the bias current $I_{bias}$ corresponding to the voltage signal $V_2$ by referring to a parameter look-up-table (LUT) in the CPU 35. FIG. 2 shows an example of an address space of the LUT. The LUT includes two tables, TA1 and TA2, the former of which stores, in connection with temperatures, $T_o, T_1, \ldots, T_m$, a plurality of modulation currents, $I_{mod}^{(0)}, I_{mod}^{(1)}, \ldots, I_{mod}^{(m)}$; the latter of which stores, in connection with bias currents, $I_{bias}^{(0)}, I_{bias}^{(1)}, \ldots, I_{bias}^{(n)}$, a plurality of modulation currents $I_{mod}^{(m)}, I_{mod}^{(m+1)}, I_{mod}^{(m+2)}, \ldots, I_{mod}^{(m+n+1)}$. The second control unit 15 may switch the tables for setting the modulation current $I_{mod}$ based on a comparison between the temperature T and a preset transition temperature Tα.

Further specifically, the second control unit 15 reads one of modulation currents from the LUT described above, which is to be set in the second D/A-C 33, based on the current bias current $I_{bias}$ or the current temperature T. The modulation current $I_{mod}$ may be adjusted by a new digital signal thus set in the second D/A-C 33. New modulation current may keep the extinction ratio of the optical signal output from the LD 3. The extinction ratio depends on the modulation current $I_{mod}$, the bias current $I_{bias}$ and an inherent I-L characteristic of the LD 3. Concurrent with the extinction ratio, the average output $P_{OUT}$ of the LD 3, which is also determined by an equation of two currents, $P_{OUT}=I_{bias}+I_{bias}/2$, may be solely determined by the APC circuit; therefore, the average power $P_{OUT}$ is independent of the temperature and the time degradation of the LD 3. The extinction ratio strongly depends on two currents and the I-L characteristic of the LD 3 by an equation of:

$$R[\text{extinction ratio}]=(I_{bias}+I_{mod}-I_{th})/(I_{bias}-I_{th}),$$

where $I_{th}$ is the threshold current of the LD. Accordingly, the extinction ratio R may be substantially kept constant by constructing the LUT for the modulation current $I_{mod}$ so as to follow the equation above.

Figure 4A:
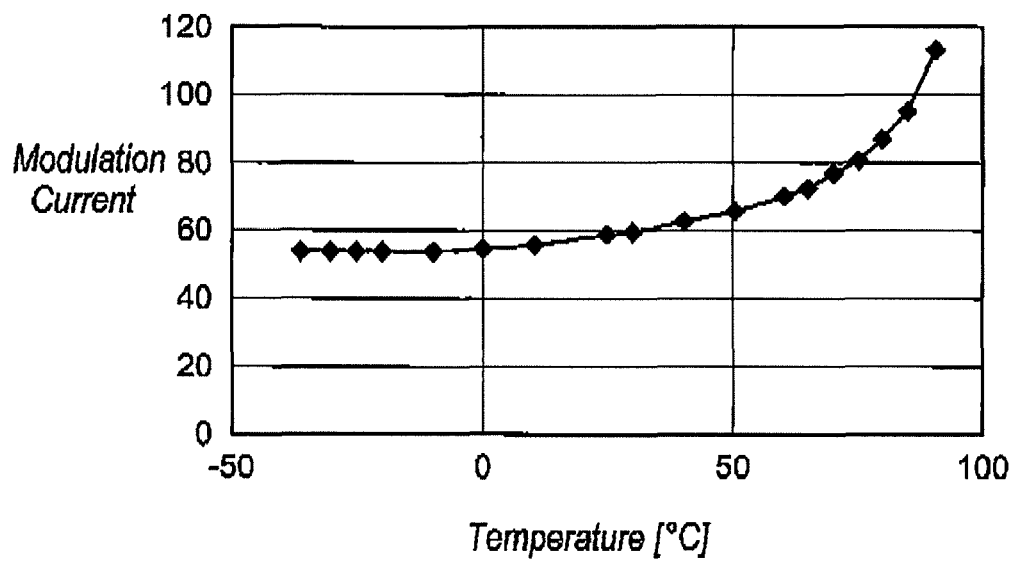
FIG. 4A shows a behavior of the modulation current to the temperature.

As already described, it is necessary for the optical transmitter 1 to take the I-L characteristic of the LD shown in FIG. 3 in order to maintain the average output power and the extinction ratio constant. That is, it needs to increase both the bias current $I_{bias}$ and the modulation current $I_{mod}$ as the temperature increases. When the modulation current $I_{mod}$ to be set in the LUT based on the temperature T and the bias current $I_{bias}$/the modulation current $I_{mod}$ behaves as shown in FIGS. 4A and 42, respectively, where respective points in FIG. 4B correspond to data measured under a condition the temperature increases by a constant rate.

Figure 4B:
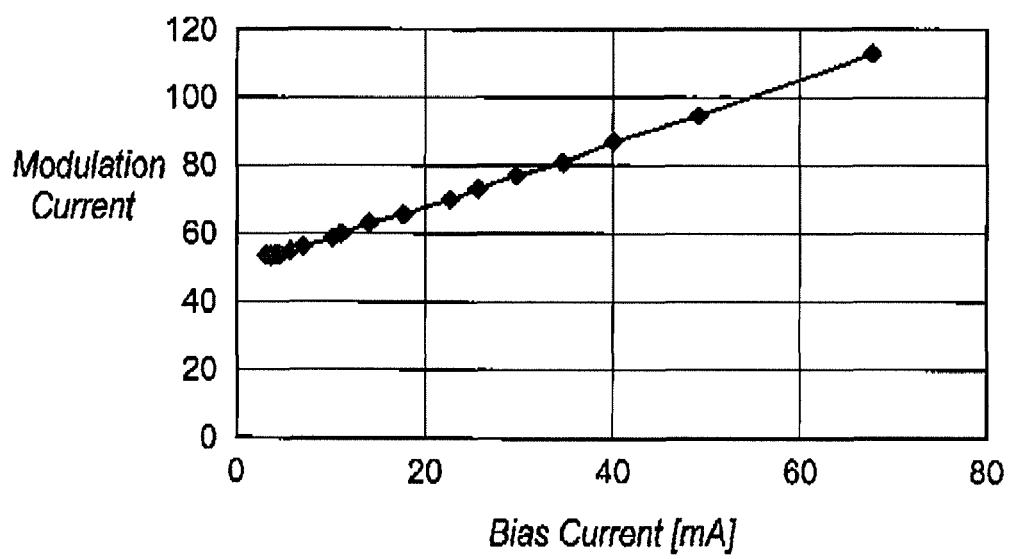
FIG. 4B shows a behavior of the modulation current to the bias current.

The modulation current $I_{mod}$ exponentially increases with respect to the temperature, and because the slope of the behavior considerably increases in a region over 60° C., greater accuracy and a fine step in the temperature will be necessary in the LUT. On the other hand, as shown in FIG. 4B, the behavior of the modulation current $I_{mod}$ with respect to the bias current $I_{bias}$ shows almost linear dependence in whole ranges of the bias current $I_{bias}$ because the dependence thereof on the temperature becomes quite small at lower temperatures. Thus, when the same accuracy for the modulation current $I_{mod}$ in lower temperatures compared with those in higher temperatures, it is inevitable to secure at lower temperatures a greater significant figure in the LUT and to prepare an A/D-C with larger resolution.

Furthermore, when a greater extinction ratio is requested, the bias current $I_{bias}$ is set to be almost equal to be the threshold current $I_{th}$ of the LD, which sometimes less than 1 mA. Then, the A/D-C used under such a condition is necessary to have a substantial accuracy around null inputs. The digital processing for a signal inevitable attributes with the quantizing error by ±1 bit. When the input of the A/D-C becomes small, almost null, the quantizing error reciprocally expands with the true input.

Therefore, the second control unit 15 according to the present invention divides the control sequence into two algorithms at a transition temperature T·α, and uses the first table TA1 where the modulation currents $I_{mod}$ are linked with the temperatures at a region lower than the transition temperature, while, in a region over the transition temperature T·α, the control sequence in the second control unit 15 uses the second table TA2 where the modulation currents $I_{mod}$ are linked with the bias currents $I_{bias}$. The transition temperature T·α may be set such that, after the modulation current $I_{mod}$ are measured to create the table TA1 by changing the temperature in a almost same step as shown in FIG. 4A, the change in the extinction ratio becomes 0.1 [dB/° C.] under the constant driving current $I_{bias}+I_{mod}$ of the LD. This is because the specification of an optical transceiver that implements with the optical transmitter 1 similar to that of the present invention rules the fluctuation of the extinction ratio of the output light must be less than 0.1 [dB/° C.]. The transition temperature T·α may be set from about 40 to 60° C., 50±10° C. The second control unit 15 refers to the first table TA1 to determine the modulation current $I_{mod}$ when the temperature T is less than the transition temperature T·α; while, the unit 15 refers to the bias current $I_{bias}$ stored in the second table TA22 when the temperature exceeds the transition temperature T·α.

Moreover, the second control unit 15 operates, at the booting of the optical transmitter 1, so as to determine the bias current $I_{bias}$ by referring to the first table TA1 always. Specifically, the second control unit 15 refers to the first table TA1 during while the change in the temperature exceeds a threshold β, which is typically about 6 [° C./30 sec]=12 [° C./min]. This is because the temperature of the LD 3 widely changes for about 30 seconds after the starting up and the control unit 15 may avoid a large discrepancy in the modulation current $I_{mod}$ at the switching from the table TA1 to the other TA2.

Figure 5:
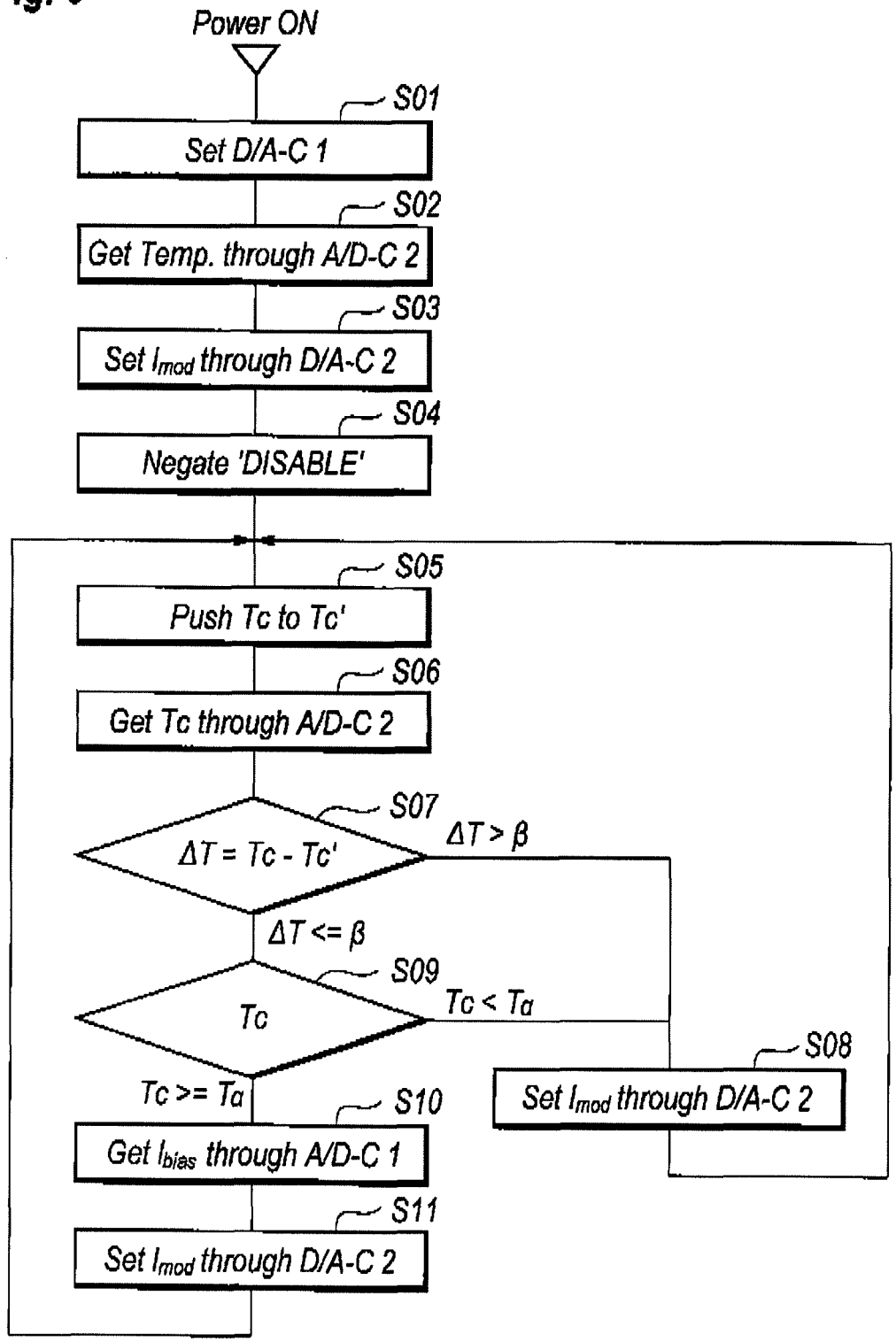
FIG. 5 shows a flow chart to control the laser diode according to an embodiment of the invention.

FIG. 5 explains an algorithm of the operation according to the present invention. First, an initial routine is carried out after the optical transmitter 1 is powered on until the optical output becomes active. The control unit 15 set the voltage signal $V_1$ in the first D/A-C 31 at step S01. The step S02 gets a temperature Tc by the second A/D-C 29, and the modulation current $I_{mod}$ may be determined by referring to the first table TA1 at step S03.

Subsequently, negating DISABLE, the optical output by the LD 3 becomes active at step S04. Synchronous with the negation of DISABLE, the APC loop of the PD 5, the resistor 7 and the first control unit 9 also becomes active. The process shown in FIG. 5 next iterates steps from S05 to S11, namely, first pushing the current temperature Tc to Tc' at step S05, measuring the next current temperature Tc at step S06, the sequence, and comparing the current temperature Tc with the last temperature Tc' at step S07. When the difference in the temperatures exceeds the threshold β for the variation in the temperature, the second control unit 15 sets a new modulation current $I_{mod}$ in the second D/A-C 33 at step S08.

On the other hand, the difference in the temperature ΔT is less than the threshold β, the second control unit 15 further verifies whether the current temperature Tc is greater or less than the transition temperature T·α. When the current temperature Tc is less than the transition temperature T·α, step S09, the second control unit 15 sets a new modulation current $I_{mod}$ based on the first table TA1 at step S08. While, the second control unit 25 monitors the current bias current $I_{bias}$ through the first A/D-C 27 at step S10, and sets a new modulation current $I_{mod}$ based on the second table TA2 at step S11. Thus, the algorithm iterates steps from S05 to S11.

The control process carried out in the optical transmitter 1 for the LD 3 thus described operates the bias current $I_{bias}$ so as to maintain the average optical power in constant by the loop of the PD 5, the resistor 7 and the first control unit 9, which is what is called as the APC loop. At same time of the control of the bias current $I_{bias}$, the optical transmitter 1 measures the operating temperature of the LD 3 to control the modulation current $I_{mod}$. A specific device, such as thermistor with larger temperature dependence in the resistance thereof, is necessary to be arranged immediately close to the LD 3 within a package, which increases a count of lead pins and a size of the package. An optical transceiver installing such an optical device with the package usually follows the standard with limited dimensions for the outer shape thereof, which is almost impossible to show a realizable arrangement. One solution is known in which the optical transceiver arranges the temperature sensing device out of the optical device, for instance, on the circuit board that mounts the control circuit, and substitutes an ambient temperature of the optical device inside the optical transceiver for the operating temperature of the LD. Generally, both the bias current $I_{bias}$ and the modulation current $I_{mod}$, which makes the average power and the extinction ratio of the LD in constant, are held with respect to the temperature in the memory as the look-up-table, and the LD is driven in accordance with both currents. However, as described above, the conventional algorithm requires a fine temperature step and an enhanced accuracy for the measured temperatures because the modulation current $I_{mod}$ exponentially behaves in higher temperatures.

Moreover, the method to adjust the modulation current $I_{mod}$ based on the ambient temperature measured apart from the LD, where a thermal pass from the LD to the temperature sensor becomes larger; accordingly, it takes a longer period from the powering on the system until the optical output becomes stable. Moreover, the ambient temperature depends on the fluctuation of the temperature of not only the LD but the other electronic circuit mounted on the circuit board. The conventional optical transmitter controls or adjusts the driving current for the LD under the single algorithm, which inevitably spends a lot of time until the optical output performance of the optical transmitter becomes stable.

The optical transmitter according to the present embodiment provides the second control unit 15 that sets the modulation current $I_{mod}$ based on the temperature of the LD, or the ambient temperature of the optical transmitter inside the optical transceiver when the temperature is less than the transition temperature; while, the control unit 15 sets the modulation current $I_{mod}$ based on the bias current $I_{bias}$ currently flowing in the LD. Accordingly, the step of the temperature for setting the modulation current $I_{mod}$ is unnecessary to be further finer and the D/A-C to set the modulation current is unnecessary to provide a greater resolution.

Figure 9:
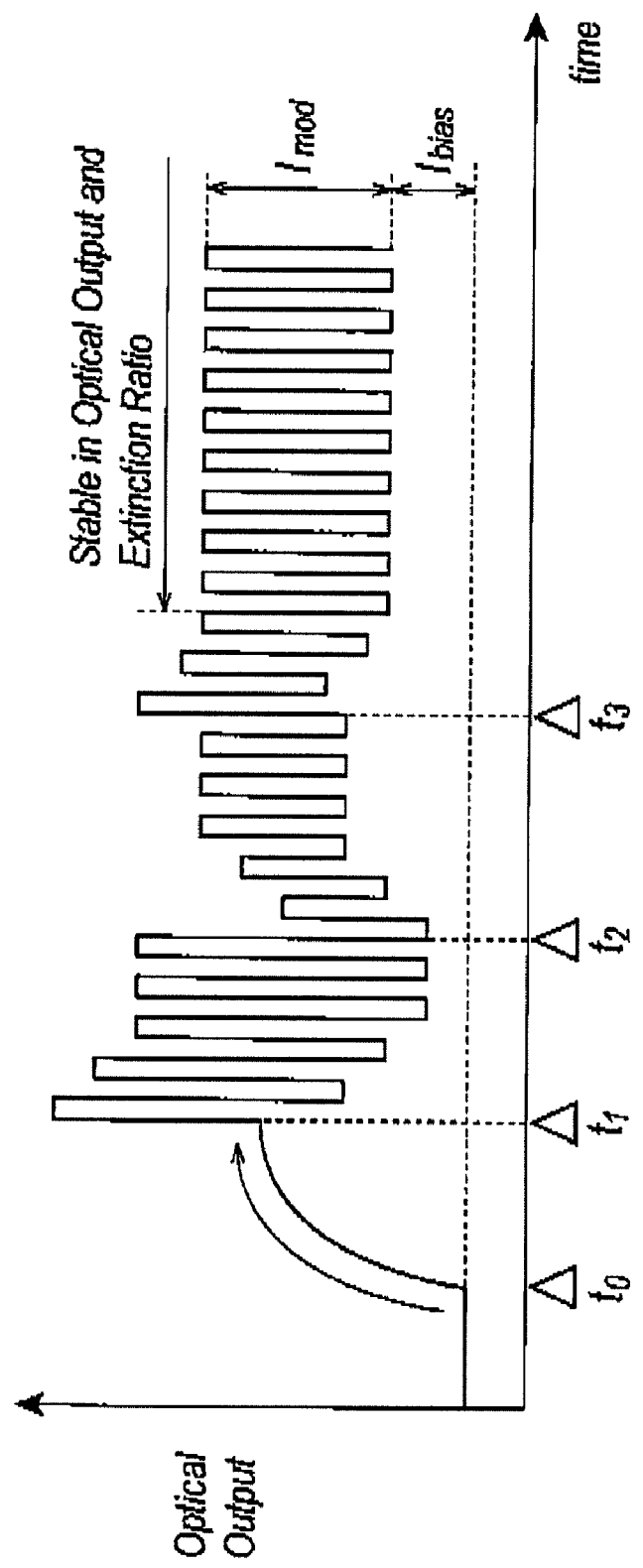
FIG. 9 shows a behavior of the output of the conventional optical transmitter with the function to switch the look-up-table.

The second control unit 15 of the embodiment always refers to the first table TA1 when the change of the temperature ΔT exceeds the threshold temperature. In a case the second control unit 15 automatically refers to the bias current when the temperature exceeds the transition temperature T·α, the control unit 15 inevitably refers to the second table even in the optical transmitter is powered on. However, the optical output is inactive, and both the modulation and bias currents are set to be zero at the powering on of the optical transmitter, then, the APC loop for the bias current $I_{bias}$ becomes active by the powering on or the negation of 'DISABLE', which sometimes increases the bias current $I_{bias}$ drastically exceeding a critical current that breaks the LD. Moreover, when the temperature is higher than the transition temperature T·α, the modulation current $I_{mod}$ also extremely increases. The APC loop subsequently decreases the bias current $I_{bias}$ so as to set the optical power in a target value, and the second control unit 15 also decreases based on thus reduced bias current $I_{bias}$. Accordingly, the optical output of the optical transmitter shows iterates large peaks and valleys as shown in FIG. 9. In FIG. 9, the optical transmitter is powered on at t0, the modulation current $I_{mod}$ is adjusted at times t1 to t3.

Figure 6:
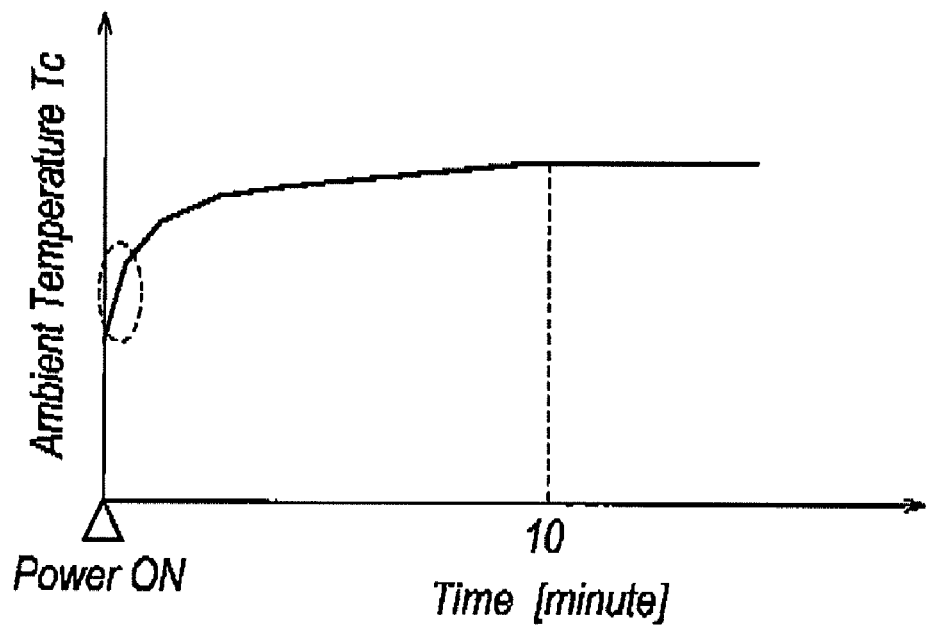
FIG. 6 shows an example of a change in the temperature of the optical transmitter shown in FIG. 1.
Figure 7:
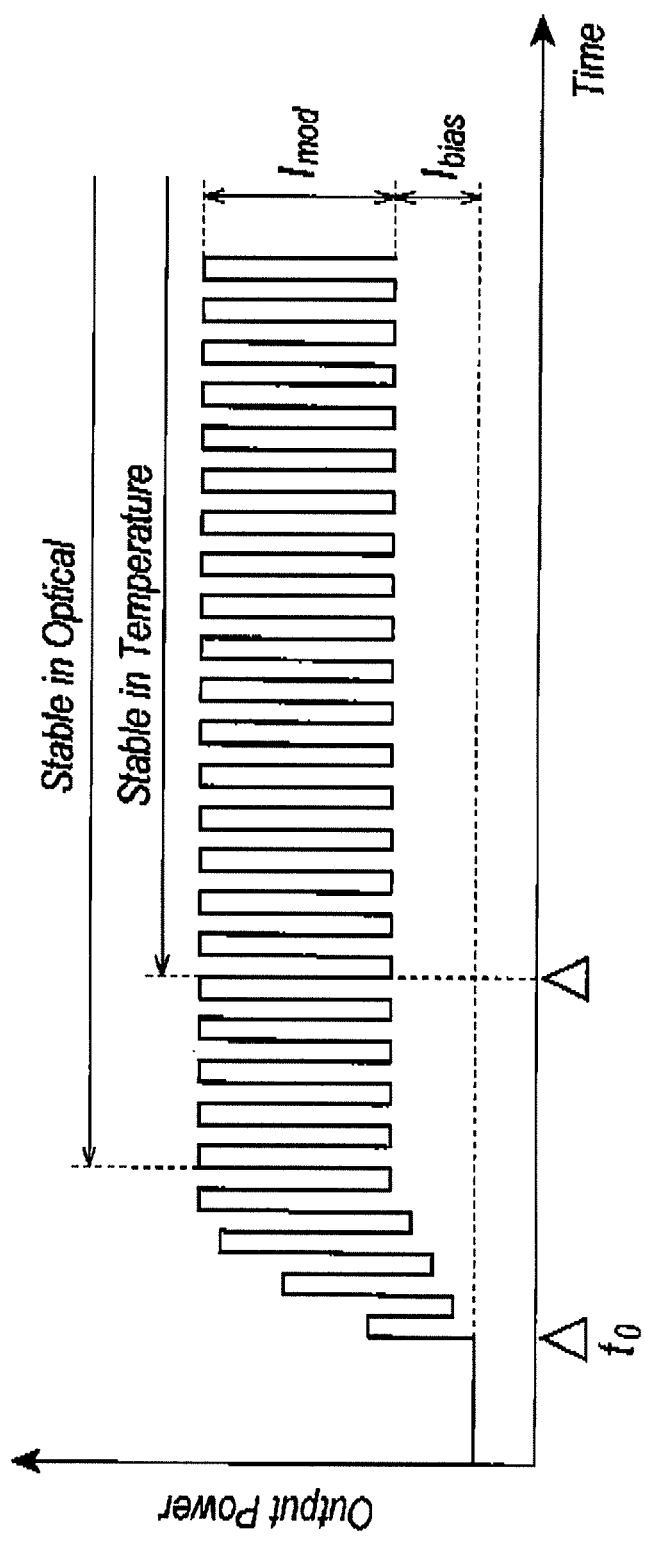
FIG. 7 shows a behavior of the output of the optical transmitter according to an embodiment of the invention.

On the other hand, the second control unit according to the present embodiment sets the modulation current $I_{mod}$ by referring to the first table TA1 forcedly at the initial step after the powering on of the optical transmitter or the negation of 'DISABLE', which may set the modulation current close to a target value and may reduce the overshoots and the undershoots in the optical output power of the transmitter. The second control unit 15 continues to refer to the first table TA1 during the change of the temperature ΔT exceeds the threshold β. The temperature considerably varies just after the powering on due to the self heating as shown in FIG. 6. The second control unit 15 always monitors the change in the temperature to switch the table for determining the modulation current $I_{mod}$. This algorithm may suppress the change in the modulation current $I_{mod}$ at the switching of the reference table; accordingly, the optical output power of the LD 3 promptly becomes stable without causing the overshoot and undershoot.

Figure 8:
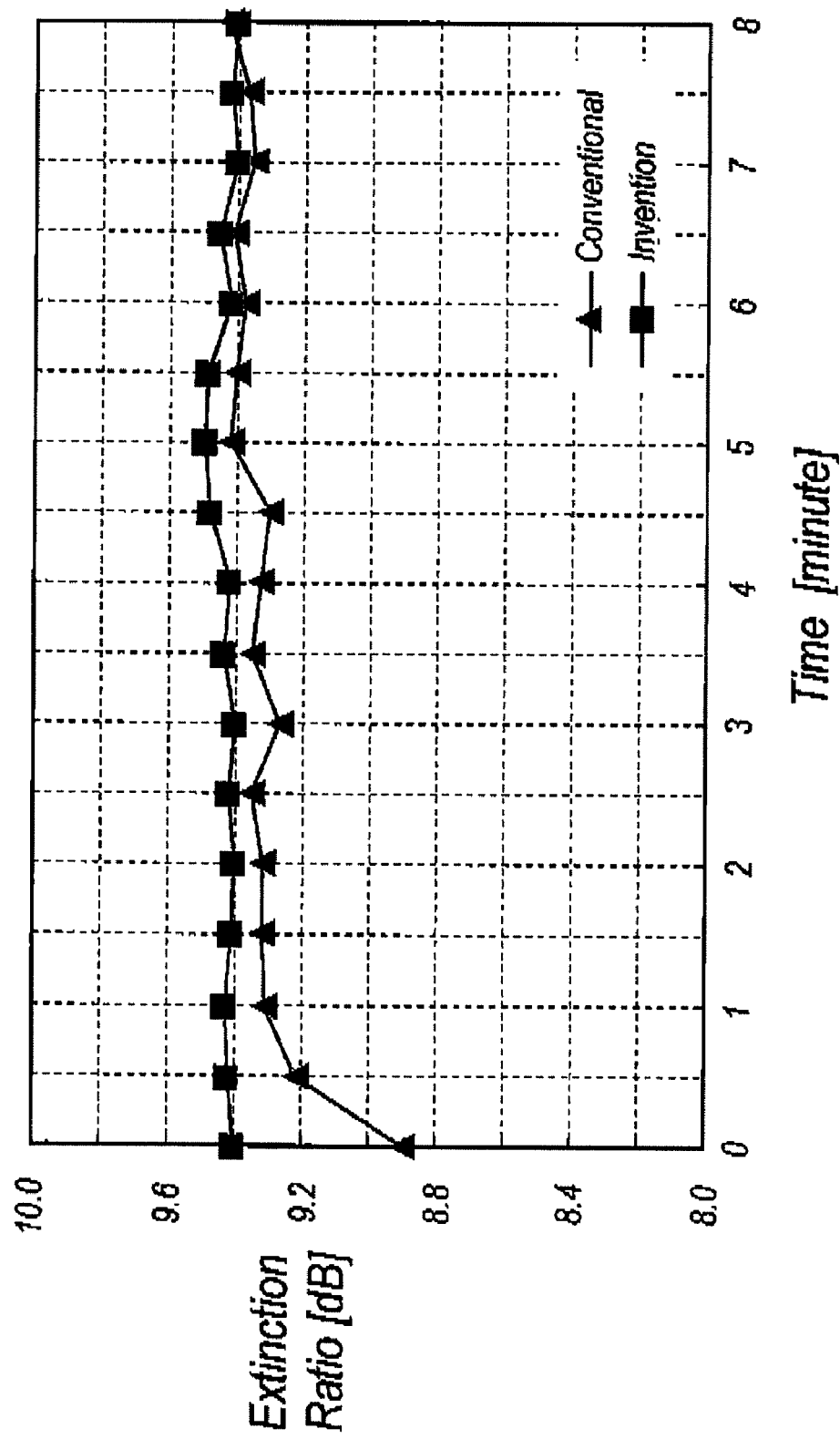
FIG. 8 compares the time behavior of the extinction ratio according to an embodiment of the present invention and that of the conventional optical transmitter without the function to switch the look-up-table.

FIG. 8 compares the time variation of the extinction ratio of the optical transmitter without using the second table TA2, which is similar to those configured in a conventional transmitter, with that using the second table TA2. The conventional optical transmitter needs a several minutes to make the extinction ratio stable, while, the transmitter according to the embodiment realizes the stable operation just after the powering on.

What is claimed is:

1. A method to drive a semiconductor laser diode by providing a modulation current and a bias current, comprising steps of:
   monitoring a temperature of said laser diode;
   calculating a temperature difference between said monitored temperature and a lastly monitored temperature of said laser diode, and
   setting said modulation current according to said monitored temperature when said temperature difference exceeds a threshold difference, or
   setting said modulation current according to said bias current when said temperature difference is less than said threshold difference.

2. The method of claim 1,
   further comprising a step of, before said step of monitoring said temperature of said laser diode,
   setting said bias current such that an average optical power output from said laser diode is kept constant in a preset value with respect to said temperature of said laser diode.

3. The method of claim 1, wherein said threshold difference is less than 12° C./min.

4. The method of claim 1,
   further comprising a step of, before said monitoring said temperature of said laser diode,
   setting a transition temperature to a temperature where a change of an extinction ratio with respect to said temperature of said laser diode becomes 0.1 dB under a constant driving current of said bias current added with said modulation current.

5. The method of claim 1, wherein said transition temperature is 50±10° C.

6. The method of claim 1,
   further comprising steps of, after said step of calculating said temperature difference and before said step of setting said modulation current based on said monitored temperature or said bias current,
   comparing said monitored temperature with a transition temperature when said temperature difference is less than said threshold difference, and
   setting said modulation current based on said monitored temperature when said monitored temperature is lower than said transition temperature, or
   setting said modulation current based on said bias current when said monitored temperature is higher than said transition temperature.

7. A method for controlling an optical transmitter including a semiconductor laser diode to be driven by a bias current and a modulation current, said optical transmitter being made inactive by assertion of a DISABLE signal, said method comprising steps of:
   powering said optical transmitter or negating said DISABLE signal;
   monitoring a temperature of said laser diode;
   calculating a temperature difference between said monitored temperature and a lastly monitored temperature of said laser diode; and
   setting said modulation current based on said monitored temperature when said temperature difference is greater than a threshold difference, or
   setting said modulation current based on said bias current when said temperature difference is less than said threshold difference.

8. The method of claim 7,
   further comprising steps of, after said step of calculating said temperature difference and before said step of setting said modulation current based on said monitored temperature or said bias current,
   comparing said monitored temperature with a transition temperature when said temperature difference is less than said threshold difference,
   setting said modulation current based on said monitored temperature when said monitored temperature is lower than said transition temperature, or setting said modulation current based on said bias current when said monitored temperature is higher than said transition temperature.

9. The method of claim 8,
further comprising a step of, before said step of monitoring said temperature of said laser diode,
setting said transition temperature to a temperature where a change of an extinction ratio with respect to said temperature of said laser diode becomes 0.1 dB under a constant driving current of said bias current added with said modulation current.

10. The method of claim 8, wherein said transition temperature is 50±10° C.

11. The method of claim 7,
further comprising steps of, concurrently with and independent of said steps of monitoring said temperature,
monitoring an average optical power output from said laser diode,
comparing said average optical power with a reference, and
setting said bias current such that said average optical power becomes substantially equal to said reference.

12. The method of claim 7,
wherein said threshold difference is less than 12° C./min.

* * * * *